US012761276B2

(12) United States Patent
Miyaguchi et al.

(10) Patent No.: US 12,761,276 B2
(45) Date of Patent: Oct. 13, 2026

(54) FAILURE DETECTION CIRCUIT, SEMICONDUCTOR DEVICE AND FAILURE DETECTION METHOD

(71) Applicant: Renesas Electronics Corporation, Tokyo (JP)

(72) Inventors: Akira Miyaguchi, Tokyo (JP); Daisuke Kawakita, Tokyo (JP); Masaaki Hirano, Tokyo (JP); Shogo Suzuki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 174 days.

(21) Appl. No.: 18/773,937

(22) Filed: Jul. 16, 2024

(65) Prior Publication Data

US 2025/0102571 A1 Mar. 27, 2025

(30) Foreign Application Priority Data

Sep. 22, 2023 (JP) ................................. 2023-159156

(51) Int. Cl.
*G01R 31/317* (2006.01)
*H03K 3/037* (2006.01)
*H03K 19/20* (2006.01)

(52) U.S. Cl.
CPC . *G01R 31/31727* (2013.01); *G01R 31/31703* (2013.01); *H03K 3/037* (2013.01); *H03K 19/20* (2013.01)

(58) Field of Classification Search
None
See application file for complete search history.

(56) References Cited

U.S. PATENT DOCUMENTS

2011/0317802 A1* 12/2011 Rohleder .................. G06F 1/04 377/104
2023/0155592 A1 5/2023 Moriyama

FOREIGN PATENT DOCUMENTS

JP 2023-073928 A 5/2023

* cited by examiner

*Primary Examiner* — Jas A Sanghera
(74) *Attorney, Agent, or Firm* — Rimon P.C.

(57) ABSTRACT

A failure detection circuit is provided in the target circuit having a first circuit area for operating in synchronization with the first clock signal, a first detection circuit for outputting a first detection result obtained by transitioning the voltage level in synchronization with the first clock signal, the first clock signal a second detection circuit for outputting a second detection result obtained by transitioning the voltage level in synchronization with, and a first comparison circuit for outputting a first comparison result by comparing the first detection result and the second detection result. Accordingly, by the failure detection circuit, it is possible to detect the failure accurately.

10 Claims, 9 Drawing Sheets

FAILURE DETECTION CIRCUIT, SEMICONDUCTOR DEVICE AND FAILURE DETECTION METHOD

CROSS-REFERENCE TO RELATED APPLICATIONS

The disclosure of Japanese Patent Application No. 2023-159156 filed on Sep. 22, 2023, including the specification, drawings and abstract is incorporated herein by reference in its entirety.

BACKGROUND

The present disclosure relates to a failure detection circuit, a semiconductor device, and a failure detection method, for example, a failure detection circuit, a semiconductor device, and a failure detection method suitable for accurately detecting a failure.

There are disclosed techniques listed below.

[Patent Document 1] Japanese Unexamined Patent Application Publication No. 2023-073928

Patent Document 1 discloses a semiconductor device for reducing the security risk due to fault injection attack.

SUMMARY

A semiconductor device disclosed in Patent Document 1, only measures to reduce the security risk due to the fault injection attack is taken, it is impossible to detect the failure by the fault injection attack, there is a problem that. Other objects and novel features will become apparent from the description of this specification and the accompanying drawings.

A failure detection circuit according to the present disclosure is provided in the target circuit having a first circuit area for operating in synchronization with a first clock signal, a first detection circuit for outputting a first detection result obtained by transitioning the voltage level in synchronization with the first clock signal, a second detection circuit for outputting a second detection result obtained by transitioning the voltage level in synchronization with the first clock signal, and a first comparator for outputting a first comparison result by comparing the first detection result and the second detection result.

A failure detection method according to the present disclosure, a failure detection method by a failure detection circuit provided in the target circuit having a first circuit area which operates in synchronization with a first clock signal, using a first detection circuit, and outputs a first detection result of transitioning the voltage level in synchronization with the first clock signal, using a second detection circuit, and outputs a second detection result of transitioning the voltage level in synchronization with the first clock signal, using a first comparator, and outputs a first comparison result by comparing the first detection result and the second detection result.

The present disclosure can provide a failure detection circuit, a semiconductor device, and a failure detection method capable of accurately detecting a failure.

DETAILED DESCRIPTION

Figure 1:
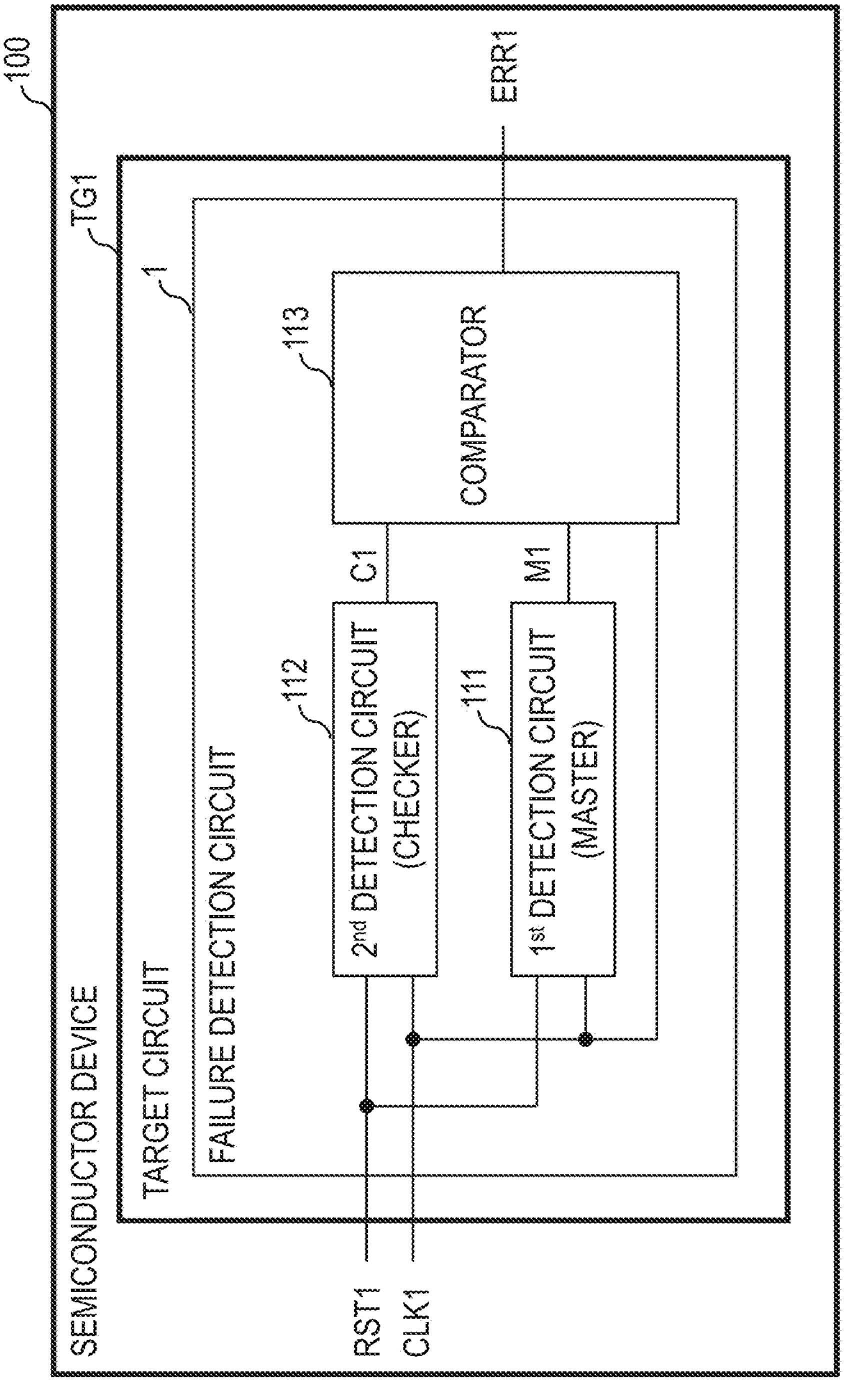
FIG. 1 is a block diagram showing a configuration example of a semiconductor device to which a failure detection circuit is applied according to a first embodiment.

Hereinafter, an embodiment will be described with reference to the drawings. Since the drawings are simplified, the technical scope of the embodiment should not be narrowly interpreted on the basis of the description of the drawings. Further, the same elements are denoted by the same reference numerals, without redundant description.

In the following embodiments, where it is necessary for convenience, it will be described by dividing it into multiple sections or embodiments. However, unless otherwise specified, they are not mutually related, one is in the relationship of some or all modifications of the other, examples of application, detailed description, supplemental explanation, etc. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, the constituent elements (including the operation steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above-mentioned numbers and the like, including the number, the numerical value, the amount, the range, and the like.

First Embodiment

FIG. 1 is a block diagram showing a configuration example of a semiconductor device 100 to which a failure detection circuit 1 is applied according to a first embodiment. For example, the semiconductor device 100 is a System on Chip (SoC) or a Microcontroller Unit (MCU).

The semiconductor device 100 shown in FIG. 1 includes a failure detection circuit 1 and a target circuit TG1 that is a failure detection target by the failure detection circuit 1. The failure detection circuit 1 is provided in the target circuit TG1, a first detection circuit 111 as a master, a second detection circuit 112 as a checker, and a comparator 113.

The first detection circuit 111 detects the rising edge of the clock signal CLK1 used in the target circuit TG1 and outputs a detection result M1. For example, the first detection circuit 111 transitions the voltage level of the detection result M1 from High level to Low level or from Low level to High level in synchronization with the rise of the clock signal CLK1. At the timing when a reset signal RST1 is used in the target circuit TG1 becomes active (e.g., High level), the first detection circuit 111 initializes the voltage level of the detection result M1 to a predetermined level (either High level or Low level).

The second detection circuit 112 detects the rising edge of the clock signal CLK1 used in the target circuit TG1 and outputs a detection result C1. For example, the second detection circuit 112 transitions the voltage level of the detection result C1 from High level to Low level or from Low level to High level in synchronization with the rise of the clock signal CLK1. At the timing when the reset signal RST1 is used in the target circuit TG1 becomes active (e.g., High level), the second detection circuit 112 initializes the voltage level of the detection result C1 to a predetermined level (either High level or Low level).

The comparator 113 compares a detection result M1 of the first detection circuit 111 with a detection result C1 of the second detection circuit 112 in synchronization with the rise of the clock signal CLK1.

In this embodiment, the first detection circuit 111 and the second detection circuit 112 detect the rising edge of the clock signal CLK1, and the comparator 113 performs a comparison operation in synchronization with the rising edge of the clock signal CLK1. It will be described as an example, but is not limited thereto. The first detection circuit 111 and the second detection circuit 112 are configured to detect a fall of the clock signal CLK1, and the comparator 113 is configured to perform a comparison operation in synchronization with the fall of the clock signal CLK1.

For example, when no failure occurs in the target circuit TG1, the detection result M1 of the first detection circuit 111 and the detection result C1 of the second detection circuit 112 are likely to the same value. Therefore, when the detection result M1 of the first detection circuit 111 and the detection result C1 of the second detection circuit 112 indicate the same value, the comparator 113 outputs an error signal ERR1 of the inactive state (e.g., Low level) indicating that no failure has occurred in the target circuit TG1.

In contrast, when a failure occurs in the target circuit TG1, the detection result M1 of the first detection circuit 111 and the detection result C1 of the second detection circuit 112 likely are different. Therefore, when the detection result M1 of the first detection circuit 111 and the detection result C1 of the second detection circuit 112 indicate a different value, the comparator 113 outputs an error signal ERR1 of an active state (e.g., High level) indicating that a failure has occurred in the target circuit TG1.

Here, the failure of the target circuit TG1 includes not only the failure that occurs naturally in the target circuit TG1, but also the tampering of the data in the target circuit TG1 due to from the outside, and the unintended operation the attack (variation) of the power supply, electromagnetic waves, and clock signals in the target circuit TG1 due to the attack from the outside.

When the error signal ERR1 is activated, the semiconductor device 100 shuts down or initializes the operation of the target circuit TG1 or the semiconductor device 100. Alternatively, when the error signal ERR1 is activated, the semiconductor device 100 may notify the outside that a failure has occurred in the target circuit TG1 or cause the software to handle by making an interrupt notification of a CPU (Central Processing Unit).

First Specific Configuration Example and Operation of the Failure Detection Circuit 1

Figure 2:
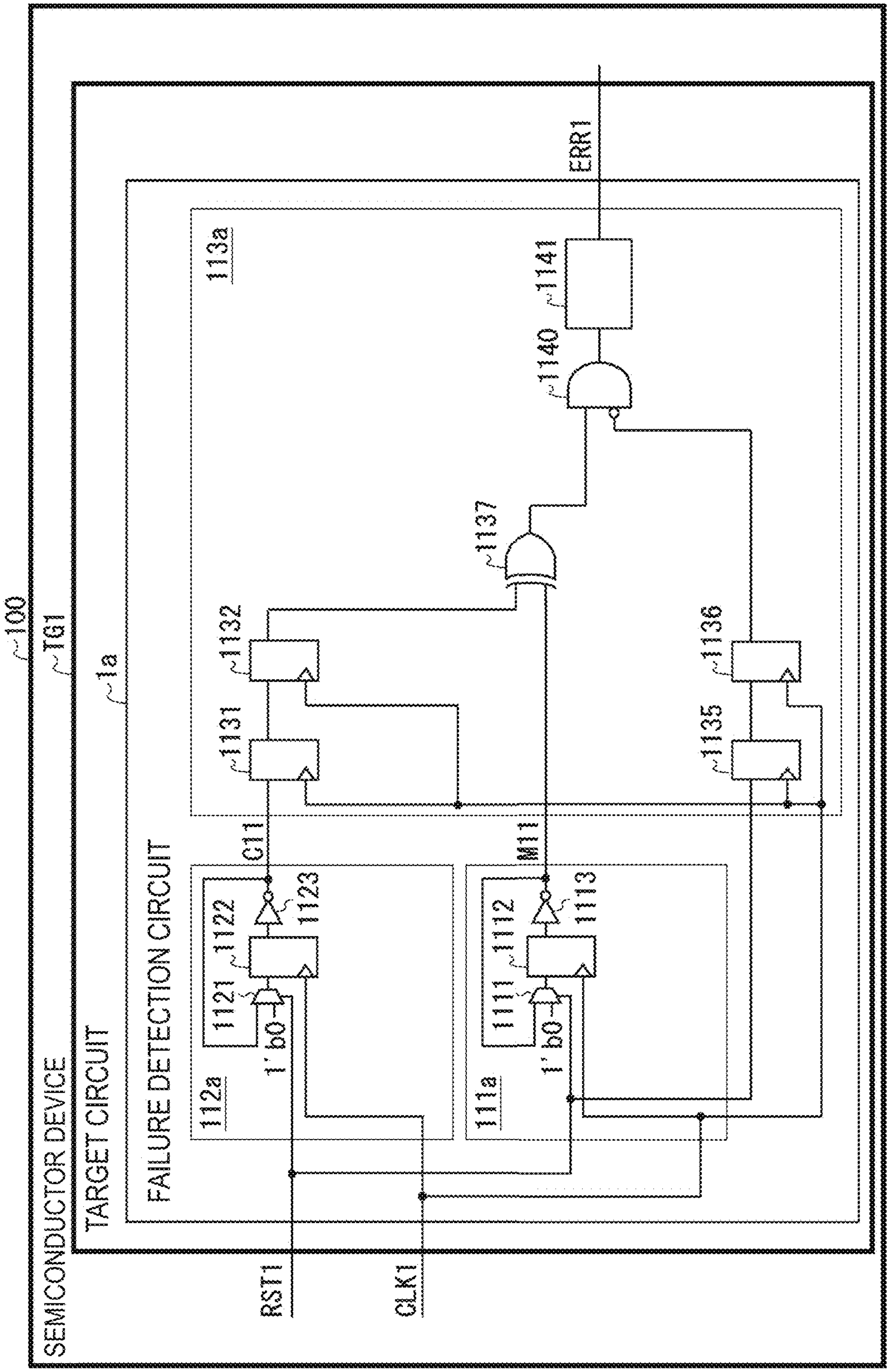
FIG. 2 is a diagram showing a first specific configuration example of failure detection circuit provided in the semiconductor device shown in FIG. 1.
Figure 3:
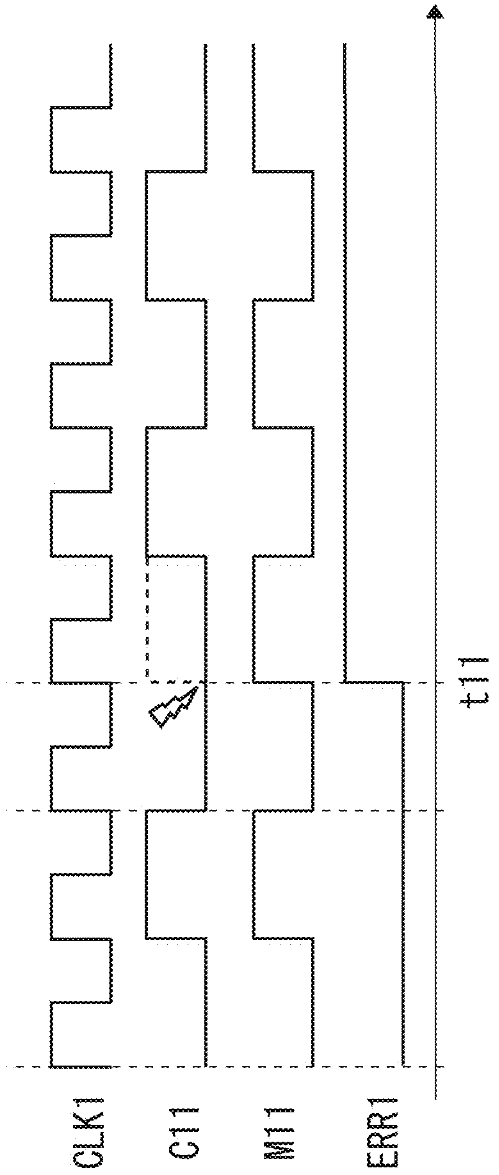
FIG. 3 is a timing chart showing the operation of the failure detection circuit shown in FIG. 2.

FIG. 2 is a diagram illustrating a first specific configuration example of the failure detection circuit 1 provided in the semiconductor device 100 as a failure detection circuit 1*a*. Incidentally, in FIG. 2, not only the failure detection circuit 1*a*, the semiconductor device 100 having a target circuit TG1 and it is also shown. Further, FIG. 3 is a timing chart showing the operation of the failure detection circuit 1*a*.

As shown in FIG. 2, the failure detection circuit 1*a* includes a first detection circuit 111*a*, a second detection circuit 112*a*, and a comparator 113*a*. The first detection circuit 111*a*, the second detection circuit 112*a*, and the comparator 113*a* correspond to the first detection circuit 111, the second detection circuit 112, and the comparator 113, respectively.

The first detection circuit 111*a* comprises a selector 1111, a flip-flop 1112, and an inverter 1113. The selector 1111 selects and outputs either the signal with the value "0" or the output of the inverter 1113 in response to the reset signal RST1. For example, the selector 1111 selects and outputs a signal with the value "0" when the reset signal RST1 is active (e.g., High level), and the selector 1111 selects and outputs the output of the inverter 1113 when the reset signal RST1 is inactive (e.g., Low level). The flip-flop 1112 takes in and outputs an output signal of the selector 1111 in synchronization with the rising edge of the clock signal CLK1. The inverter 1113 inverts and outputs the output of the flip-flop 1112. The output signal of the inverter 1113 is also used as a detection result M11 which is one of the detection results M1 of the first detection circuit 111*a*.

That is, the first detection circuit 111*a*, after initializing the detection result M11 to High level by the reset signal RST1 becomes active, the voltage level of the detection result M11, from High level to Low level in synchronization with the rise of the clock signal CLK1, to transition from Low level to High level.

The second detection circuit 112*a* comprises a selector 1121, a flip-flop 1122, and an inverter 1123. The selector 1121 selects and outputs one of the outputs of the signal and the inverter 1123 of the value "0" in response to the reset signal RST1. For example, the selector 1121, the reset signal RST1 selects and outputs a signal of the value "0" when the active (e.g., High level), the reset signal RST1 selects and outputs the output of the inverter 1123 when the inactive (e.g., Low level). The flip-flop 1122 takes in and outputs an output signal of the selector 1121 in synchronization with the rising edge of the clock signal CLK1. The inverter 1123 inverts and outputs the output of the flip-flop 1122. The output-signal of the inverter 1123 is also used as a detection result C11 which is one of the detection results C1 of the second detection circuit 112*a*.

That is, the second detection circuit 112*a*, after initializing the detection result C11 to High level by the reset signal RST1 is activated, the voltage level of the detection result C11 in synchronization with the rise of the clock signal CLK1, from High level to Low level, or, to High level from Low level to.

The comparator 113*a* includes flip-flops 1131, 1132, 1135, and 1136, an exclusive-OR circuit (hereinafter, referred to as an XOR circuit) 1137, a logical-AND circuit (hereinafter, referred to as an AND circuit) 1140, and a holding circuit 1141. The flip-flop 1131, the detection result C11 of the second detection circuit 112*a*, and outputs the taken in synchronization with the rise of the clock-signal CLK1. The flip-flop 1132 takes in and outputs the output signal of the flip-flop 1131 in synchronization with the rising edge of the clock signal CLK1. The XOR circuit 1137 outputs an exclusive OR of the output of the flip-flop 1132 and the detection result M11 of the first detection circuit 111*a*. The flip-flop 1135, a reset signal RST1, and outputs fetched in synchronization with the rising edge of the clock signal CLK1. The flip-flop 1136 takes in and outputs the output signal of the flip-flop 1135 in synchronization with the rising edge of the clock signal CLK1. The AND circuit 1140 outputs the logical product of the output signal of the XOR circuit 1137 and the inverted signal of the output signal of the flip-flop 1136. The holding circuit 1141 outputs as an error signal ERR1 holds the output signal of the AND circuit 1140.

For example, the AND circuit 1140 outputs a Low level signal when the reset signal RST1 is active (e.g., High level), and outputs a voltage-level signal corresponding to the detected M11, C11 when the reset signal RST1 is inactive (e.g., Low level). Specifically, the AND circuit 1140, when the reset signal RST1 is inactive, when the detection result M11, C11 coincides, outputs a signal of Low level, when the detection result M11, C11 does not coincide, and outputs a signal of High level. The holding circuit 1141 outputs the error signal ERR1 of the inactive state (e.g., Low level) by being initialized, the signal of the High level from the AND circuit 1140 is output timing (i.e., the detection result M11, C11 mismatch is detected timing) to switch the error signal ERR1 from the inactive state to the active state (e.g., High level).

Here, as shown in FIG. 3, if the detection result C11 of the second detection circuit 112*a* does not correctly transition from the Low level to the High level due to an attack from the outside to the target circuit TG1, the detection result M11, C11 does not coincide (time t11). At this time, the comparator circuit 113*a* outputs an error-signal ERR1 of the active state (High level) indicating that a failure has occurred in the target circuit TG1 (time t11).

Second Specific Configuration Example and Operation of the Failure Detection Circuit 1

Figure 4:
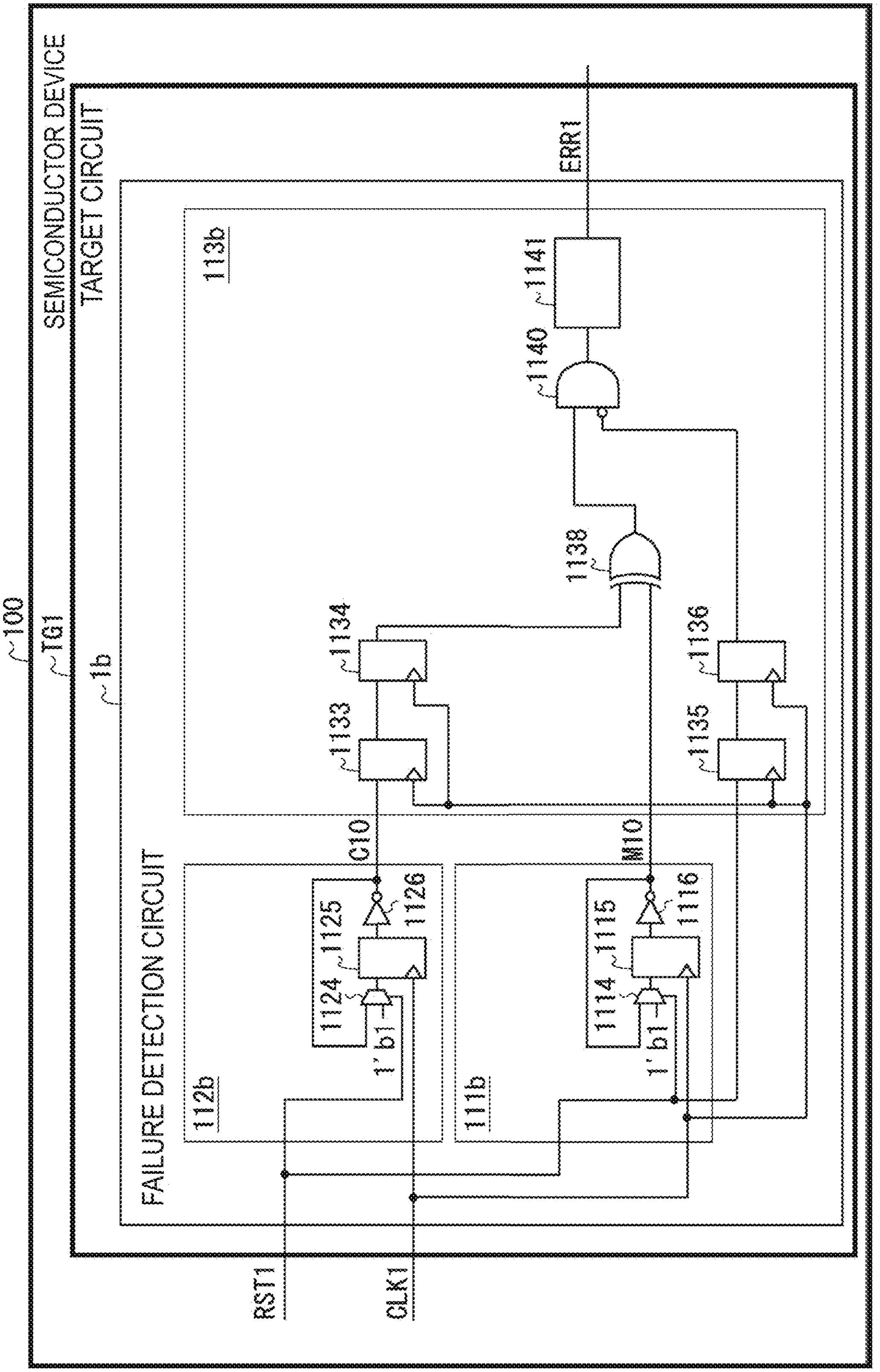
FIG. 4 is a diagram showing a second specific configuration example of the failure detection circuit provided in the semiconductor device shown in FIG. 1.
Figure 5:
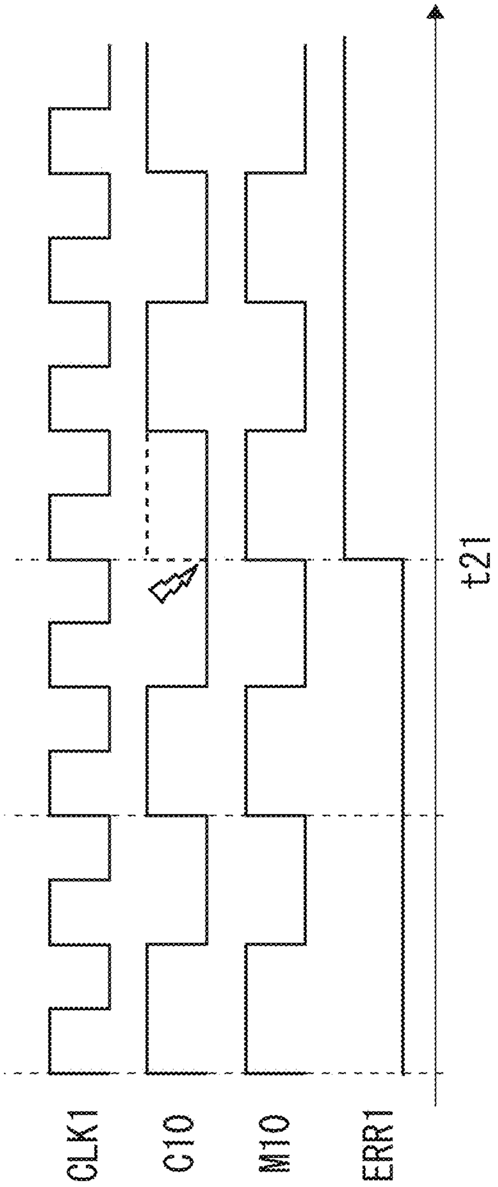
FIG. 5 is a timing chart showing the operation of the failure detection circuit shown in FIG. 4.

FIG. 4 is a diagram illustrating a second specific configuration example of the failure detection circuit 1 provided in the semiconductor device 100 as the failure detection circuit 1*b*. Incidentally, in FIG. 4, not only the failure detection circuit 1*b*, a semiconductor device 100 having a target circuit TG1 and it is also shown. Further, FIG. 5 is a timing chart showing the operation of the failure detection circuit 1*b*.

As shown in FIG. 4, the failure detection circuit 1*b* includes a first detection circuit 111*b*, a second detection circuit 112*b*, and a comparator 113*b*. The first detection circuit 111*b*, the second detection circuit 112*b*, and the comparator 113*b* correspond to the first detection circuit 111, the second detection circuit 112, and the comparator 113, respectively.

The first detector 111*b* comprises a selector 1114, a flip-flop 1115, and an inverter 1116. The selector 1114 selects and outputs one of the outputs of the signal and the inverter 1116 of the value "1" in response to the reset signal RST1. For example, the selector 1114 selects and outputs a signal having a value "1" when the reset signal RST1 is active, and selects and outputs an output of the inverter 1116 when the reset signal RST1 is inactive. The flip-flop 1115 takes in and outputs an output signal of the selector 1114 in synchronization with the rising edge of the clock signal CLK1. The inverter 1116 inverts and outputs the output of the flip-flop 1115. The output signal of the inverter 1116 is also used as a detection result M10 which is one of the detection results M1 of the first detection circuit 111*b*.

That is, the first detection circuit 111*b*, after initializing the detection result M10 to Low level by the reset signal RST1 becomes active, the voltage level of the detection result M10, from Low level in synchronization with the rise of the clock signal CLK1 High level, or, to Low level from High level.

The second detection circuit 112*b* comprises a selector 1124, a flip-flop 1125, and an inverter 1126. The selector 1124 selects and outputs one of the outputs of the signal and the inverter 1126 of the value "1" in response to the reset signal RST1. For example, the selector 1124 selects and outputs a signal having a value "1" when the reset signal RST1 is active, and selects and outputs an output of the inverter 1126 when the reset signal RST1 is inactive. The flip-flop 1125 takes in and outputs an output signal of the selector 1124 in synchronization with the rising edge of the clock signal CLK1. The inverter 1126 inverts and outputs the output of the flip-flop 1125. The output-signal of the inverter 1126 is also used as a detection result C10 which is one of the detection results C1 of the second detection circuit 112*b*.

That is, the second detection circuit 112*b*, after the detection result C10 by the reset signal RST1 becomes active is initialized to Low level, the voltage level of the detection result C10 in synchronization with the rise of the clock signal CLK1, from Low level to High level, or from High level to Low level.

The comparator circuit 113*b* comprises flip-flops 1133, 1134, 1135, and 1136, an XOR circuit 1138, an AND circuit 1140, and a holding circuit 1141. The flip-flop 1133, the detection result C10 of the second detection circuit 112*b*, and outputs the taken in synchronization with the rise of the clock signal CLK1. The flip-flop 1134 takes in and outputs the output signal of the flip-flop 1133 in synchronization with the rising edge of the clock signal CLK1. The XOR circuit 1138 outputs an exclusive OR of the output of the flip-flop 1134 and the detection result M10 of the first detection circuit 111*b*. The flip-flop 1135, a reset signal RST1, and outputs fetched in synchronization with the rising edge of the clock signal CLK1. The flip-flop 1136 takes in and outputs the output signal of the flip-flop 1135 in synchronization with the rising edge of the clock signal CLK1. The AND circuit 1140 outputs the logical product of the output signal of the XOR circuit 1138 and the inverted signal of the output signal of the flip-flop 1136. The holding circuit 1141 outputs as an error signal ERR1 holds the output signal of the AND circuit 1140.

For example, the AND circuit 1140 outputs a Low level signal when the reset signal RST1 is active (e.g., High level), and outputs a voltage-level signal corresponding to the detected M10, C10 when the reset signal RST1 is inactive (e.g., Low level). Specifically, the AND circuit 1140, when the reset signal RST1 is inactive, when the detection result M10, C10 coincides, outputs a signal of Low level, when the detection result M10, C10 does not coincide, and outputs a signal of High level. The holding circuit 1141 outputs the error signal ERR1 of the inactive state (e.g., Low level) by being initialized, the signal of the High level from the AND circuit 1140 is output timing (i.e., the detection result M10, C10 mismatch is detected timing) to switch the error signal ERR1 from the inactive state to the active state (e.g., High level).

Here, as shown in FIG. 5, if the detection result C10 of the second detection circuit 112*b* does not correctly transition from the Low level to the High level due to an attack from the outside to the target circuit TG1, the detection result M10, C10 does not coincide (time t21). At this time, the comparator 113*b* outputs an error signal ERR1 of the active state (High level) indicating that a failure has occurred in the target circuit TG1 (time t21).

Third Specific Configuration Example and Operation of the Failure Detection Circuit 1

Figure 6:
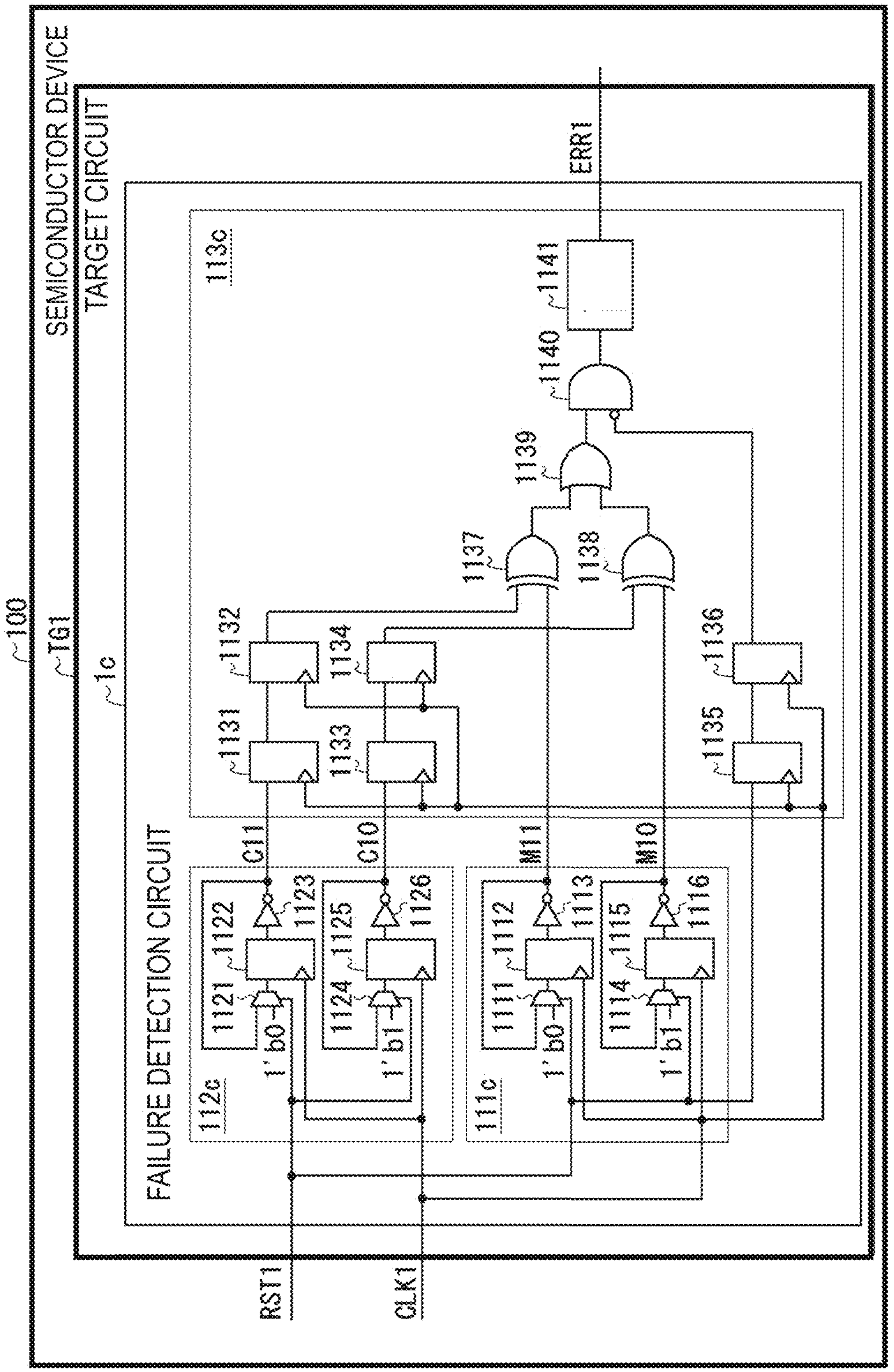
FIG. 6 is a diagram showing a third specific configuration example of the failure detection circuit provided in the semiconductor device shown in FIG. 1.
Figure 7:
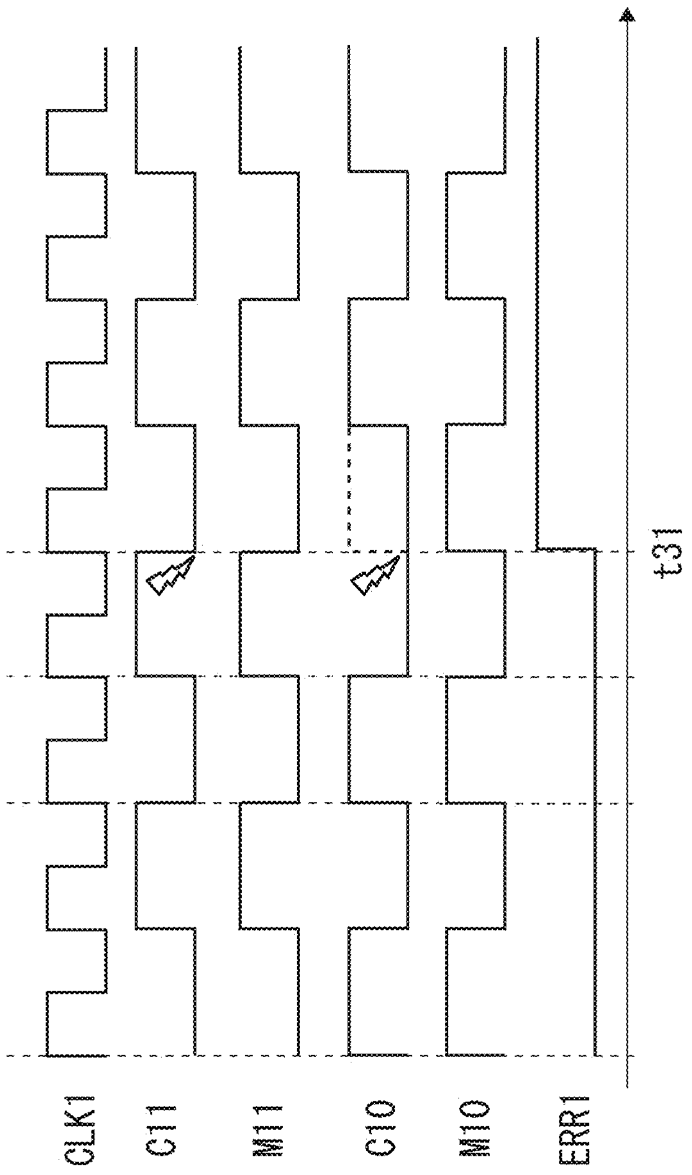
FIG. 7 is a timing chart showing the operation of the failure detection circuit shown in FIG. 6.

FIG. 6 is a diagram a third illustrating specific configuration example of the failure detection circuit 1 provided in the semiconductor device 100 as the failure detection circuit 1*c*. Incidentally, in FIG. 6, not only the failure detecting circuit 1*c*, a semiconductor device 100 having a target circuit TG1 and it is also shown. Further, FIG. 7 is a timing chart showing the operation of the failure detecting circuitry 1*c*.

As shown in FIG. 6, the failure detection circuit 1*c* includes a first detection circuit 111*c*, a second detection circuit 112*c*, and a comparator 113*c*. The first detection circuit 111*c*, the second detection circuit 112*c*, and the comparator 113*c* correspond to the first detection circuit 111, the second detection circuit 112, and the comparator 113, respectively.

The first detection circuit 111*c* includes selectors 1111 and 1114, flip-flops 1112 and 1115, and inverters 1113 and 1116. The selector 1111 selects and outputs one of the output of the signal and the inverter 1113 of the value "0" in response to the reset signal RST1. For example, the selector 1111 selects and outputs a signal having a value "0" when the reset signal RST1 is active, and selects and outputs the output of the inverter 1113 when the reset signal RST1 is inactive. The flip-flop 1112 takes in and outputs an output signal of the selector 1111 in synchronization with the rising edge of the clock signal CLK1. The inverter 1113 inverts and outputs the output of the flip-flop 1112. The output signal of the inverter 1113 is also used as a detection result M11 which is one of the detection result M1 of the first detection circuit 111*c*. The selector 1114 selects and outputs one of the output of the signal and the inverter 1116 of the value "1" in response to the reset signal RST1. For example, the selector 1114 selects and outputs a signal having a value "1" when the reset signal RST1 is active, and selects and outputs an output of the inverter 1116 when the reset signal RST1 is inactive. The flip-flop 1115 takes in and outputs an output signal of the selector 1114 in synchronization with the rising edge of the clock signal CLK1. The inverter 1116 inverts and outputs the output of the flip-flop 1115. The output-signal of the inverter 1116 is also used as a detection result M10 which is one of the detection results M1 of the first detection circuit 111*b*.

That is, the first detection circuit 111*c* initializes the detection result M11 to High level by the reset signal RST1 becomes active, and, after initializing the detection result M10, the voltage level of the detection result M11, M10, from High level to Low level in synchronization with the rise of the clock signal CLK1, or, from Low level to High level. In normal, among the detected M11, M10, if one indicates the High level, the other indicates the Low level.

The second detector 112*c* includes selectors 1121 and 1124, flip-flops 1122 and 1125, and inverters 1123 and 1126. The selector 1121 selects and outputs one of the outputs of the signal and the inverter 1123 of the value "0" in response to the reset signal RST1. For example, the selector 1121 selects and outputs a signal having a value "0" when the reset signal RST1 is active, and selects and outputs the output of the inverter 1123 when the reset signal RST1 is inactive. The flip-flop 1122 takes in and outputs an output signal of the selector 1121 in synchronization with the rising edge of the clock signal CLK1. The inverter 1123 inverts and outputs the output of the flip-flop 1122. The output-signal of the inverter 1123 is also used as a detection result C11 which is one of the detection result C1 of the second detection circuit 112*c*. The selector 1124 selects and outputs one of the outputs of the signal and the inverter 1126 of the value "1" in response to the reset signal RST1. For example, the selector 1124 selects and outputs a signal having a value "1" when the reset signal RST1 is active, and selects and outputs an output of the inverter 1126 when the reset signal RST1 is inactive. The flip-flop 1125 takes in and outputs an output signal of the selector 1124 in synchronization with the rising edge of the clock signal CLK1. The inverter 1126 inverts and outputs the output of the flip-flop 1125. The output-signal of the inverter 1126 is also used as a detection result C10 which is one of the detection results C1 of the second detection circuit 112*b*.

That is, the second detection circuit 112*c* initializes the detection result C11 to High level by the reset signal RST1 becomes active, and, after initializing the detection result C10 to Low level, the voltage level of the detection result C11, C10, High level from the High level in synchronization with the rise of the clock signal CLK1, or, to High level from Low level. In normal, among the detected C11, C10, if one indicates the High level, the other indicates the Low level.

The comparator 113*c* includes flip-flops 1131-1136, XOR circuits 1137 and 1138, a logic sum circuit (hereinafter referred to as a OR circuit) 1139, a AND circuit 1140, and a holding circuit 1141. The flip-flop 1131, the detection result C11 of the second detection circuit 112*c*, and outputs the taken in synchronization with the rise of the clock-signal CLK1. The flip-flop 1132 takes in and outputs the output signal of the flip-flop 1131 in synchronization with the rising edge of the clock signal CLK1. The XOR circuit 1137 outputs an exclusive OR of the output of the flip-flop 1132 and the detection result M11 of the first detection circuit 111*c*. The flip-flop 1133, the detection result C10 of the second detection circuit 112*c*, and outputs the taken in synchronization with the rise of the clock-signal CLK1. The flip-flop 1134 takes in and outputs the output signal of the flip-flop 1133 in synchronization with the rising edge of the clock signal CLK1. The XOR circuit 1138 outputs an exclusive OR of the output of the flip-flop 1134 and the detection result M10 of the first detection circuit 111*c*. The OR circuit 1139 outputs the logical OR of the output signal of XOR circuit 1137 and the output signal of XOR circuit 1138. The flip-flop 1135, a reset signal RST1, and outputs fetched in synchronization with the rising edge of the clock signal CLK1. The flip-flop 1136 takes in and outputs the output signal of the flip-flop 1135 in synchronization with the rising edge of the clock signal CLK1. The AND circuit 1140 outputs the logical product of the output signal of OR circuit 1139 and the inverted signal of the output signal of the flip-flop 1136. Holding circuit 1141 outputs as an error signal ERR1 holds the output signal of AND circuit 1140.

For example, the AND circuit 1140 outputs an Low level signal when the reset signal RST1 is active (e.g., High level), and outputs a voltage-level signal corresponding to the detection result M11, C11 and the detection result M10, C10 when the reset signal RST1 is inactive (e.g., Low level). Specifically, the AND circuit 1140, when the reset signal RST1 is inactive, the detection result M11, C11 coincides, and when the detection result M10, C11 coincides, outputs a signal of Low level, the detection result M11, C11 is mismatched, or when the detection result M10, C10 is mismatched, it outputs a signal of High level. Holding circuit 1141 outputs the error signal ERR1 of the inactive state (e.g., Low level) by being initialized, the signal of the High level from AND circuit 1140 is output timing (i.e., the detection result M11, C11 mismatch, or the detection result M10, C10 mismatch is detected timing) to switch the error signal ERR1 from the inactive state to the active state (e.g., High level).

Here, as shown in FIG. 7, the detection result M10 and the detection result C10 are different (time t31) when the detection result C10 does not change correctly, for example, even when the detection result M11, C11, M10 change correctly, due to an attack from the outside to the target circuit TG1. At this time, the comparator 113*c* outputs an error signal ERR1 of the active state (High level) indicating that a failure has occurred in the target circuit TG1 (time t31). That is, the failure detection circuit 1*c* can detect the failure of the target circuit TG1 with better accuracy than the failure detection circuit 1*a*, 1*b*.

As described above, the failure detection circuit 1 according to this embodiment can detect the failure of the target circuit TG1, for example, the tampering of the data in the target circuit TG1 due to the attack from the outside, and the power supply, the electromagnetic wave, and the unintended operation of the clock signal in the target circuit TG1 due to the attack from the outside at all times with good accuracy.

Second Embodiment

Figure 8:
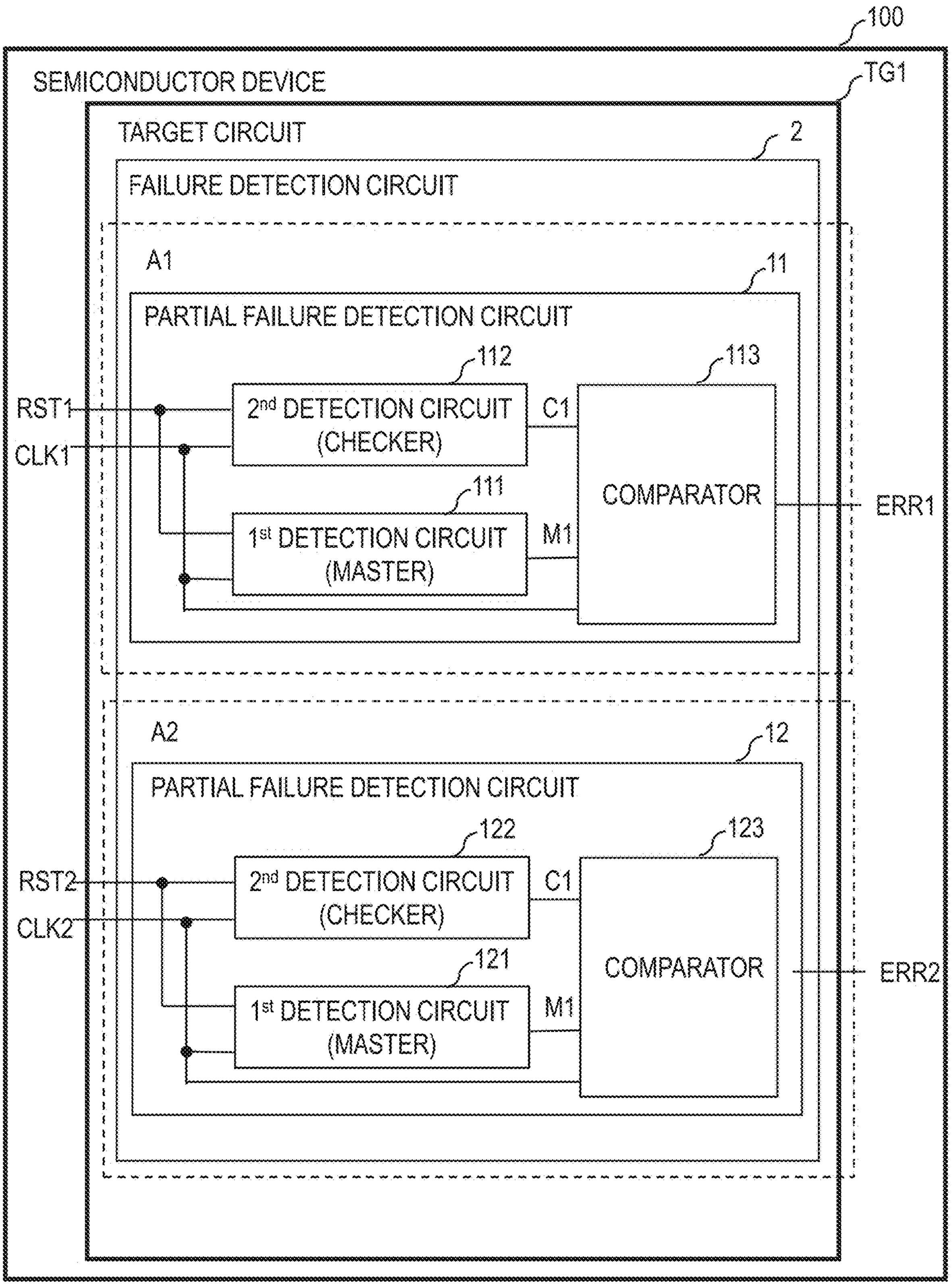
FIG. 8 is a block diagram showing a configuration example of a semiconductor device to which a failure detection circuit is applied according to a second embodiment.

FIG. 8 is a block diagram showing a configuration example of a semiconductor device 100 with a failure detection circuit 2 according to the second embodiment is applied. The failure detection circuit 2 has the first detection circuit 111, the second detection circuit 112 and the comparator 113, in addition to, further has a first detection circuit 121, the second detection circuit 122, and a comparator 123. The first detection circuit 121, the second detection circuit 122, and the comparator 123 has the same configuration as the first detection circuit 111, the second detection circuit 112, and the comparator 113 respectively.

The first detection circuit 111, the second detection circuit 112, and the comparator 113 constitutes a portion failure detection circuit 11 for detecting a failure of the circuit area A1 operated in synchronization with the clock signal CLK1 of the target circuit TG1. The first detection circuit 121, the second detection circuit 122, and the comparator 123 constitutes a portion failure detection circuit 12 for detecting a failure of the circuit area A2 operated in synchronization with the clock signal CLK2 of the target circuit TG1.

Basically, configurations and operations of the partial failure detection circuit 11, the second detection circuit 112, and the comparator 113 in the first detection circuit 111 are described above. However, when the detection result M1 of the first detection circuit 111 and the detection result C1 of the second detection circuit 112 indicates the same value, the comparator 113 outputs an error signal ERR1 of the inactive state (e.g., Low level) indicating that no failure has occurred in the circuit area A1 in synchronization with the clock signal CLK1 of the target circuit TG1. Further, when the detection result M1 of the first detection circuit 111 and the detection result C1 of the second detection circuit 112 indicates a different value, the comparator 113 outputs an error signal ERR1 of the active state (e.g., High level) indicating that a failure has occurred in the circuit area A1 in synchronization with the clock signal CLK1 of the target circuit TG1.

In this embodiment, the first detection circuit 111 and the second detection circuit 112 detect the rising edge of the clock signal CLK1, and the comparator 113 performs a comparison operation in synchronization with the rising edge of the clock signal CLK1. It will be described as an example, but is not limited thereto. The first detection circuit 111 and the second detection circuit 112 are configured to detect a fall of the clock signal CLK1, and the comparator 113 is configured to perform a comparison operation in synchronization with the fall of the clock signal CLK1.

Subsequently, the first detection circuit 121 includes the partial failure detection circuit 12, a second detection circuit 122, and a comparator 123.

The first detection circuit 121 detects the rising edge of the clock signal CLK2 used in the target circuit TG1 and outputs a detection result M2. For example, the first detection circuit 121 transitions the voltage level of the detection result M2 from High level to Low level or from Low level to High level in synchronization with the rise of the clock signal CLK2. At the timing when the reset signal RST2 is used in the target circuit TG1 becomes active (e.g., High level), the first detection circuit 121 initializes the voltage level of the detection result M2 to a predetermined level (either High level or Low level).

The second detection circuit 122 detects the rising edge of the clock signal CLK2 used in the target circuit TG1 and outputs a detection result C2. For example, the second detection circuit 122 transitions the voltage level of the detection result C2 from High level to Low level or from Low level to High level in synchronization with the rise of the clock signal CLK2. The second detection circuit 122, at the timing when the reset signal RST2 is used in the target circuit TG1 becomes active (e.g., High level), initializes the voltage level of the detection result C2 to a predetermined level (either High level or Low level).

The comparator 123 compares the detection result M2 of the first detection circuit 121 with the detection result C2 of the second detection circuit 122 in synchronization with the rise of the clock signal CLK2, In this embodiment, the first detection circuit 121 and the second detection circuit 122 detect the rising edge of the clock signal CLK2, and the comparator 123 performs a comparison operation in synchronization with the rising edge of the clock signal CLK2. It will be described as an example, but is not limited thereto. The first detection circuit 121 and the second detection circuit 122 are configured to detect a fall of the clock signal CLK2, and the comparator 123 is configured to perform a comparison operation in synchronization with the fall of the clock signal CLK2.

For example, if the failure has not occurred in the circuit area A2 that operates in synchronization with the clock signal CLK2 of the target circuit TG1, the detection result M2 of the first detection circuit 121 and the detection result C2 of the second detection circuit 122 are likely to be the same value. Therefore, when the detection result M2 of the first detection circuit 121 and the detection result C2 of the second detection circuit 122 indicates the same value, the comparator 123 outputs an error signal ERR2 of the inactive state (e.g., Low level) indicating that a failure has not occurred in the circuit area A2 of the target circuit TG1.

In contrast, when a failure occurs in the circuit area A2 of the target circuit TG1, the detection result M2 of the first detection circuit 121 and the detection result C2 of the second detection circuit 122 are likely to be different. Therefore, when the detection result M2 of the first detection circuit 121 and the detection result C2 of the second detection circuit 122 indicate different values, the comparator 123 outputs an error signal ERR2 of the active state (e.g., High level) indicating that a failure has occurred in the circuit area A2 of the target circuit TG1.

Thus, in the failure detection circuit 2 according to this embodiment, it is possible to individually detect a failure of a plurality of circuit areas operating in synchronization with differing clock signal of the target circuit TG1. This facilitates identification of the cause of the failure.

In this embodiment, the failure detection circuit 2 has been described as an example a case with two partial failure detection circuits 11, 12, but is not limited thereto. The failure detection circuit 2 may include three or more partial failure detection circuit disposed in three or more circuit areas that operate in synchronization with different clock signals, respectively.

Third Embodiment

Figure 9:
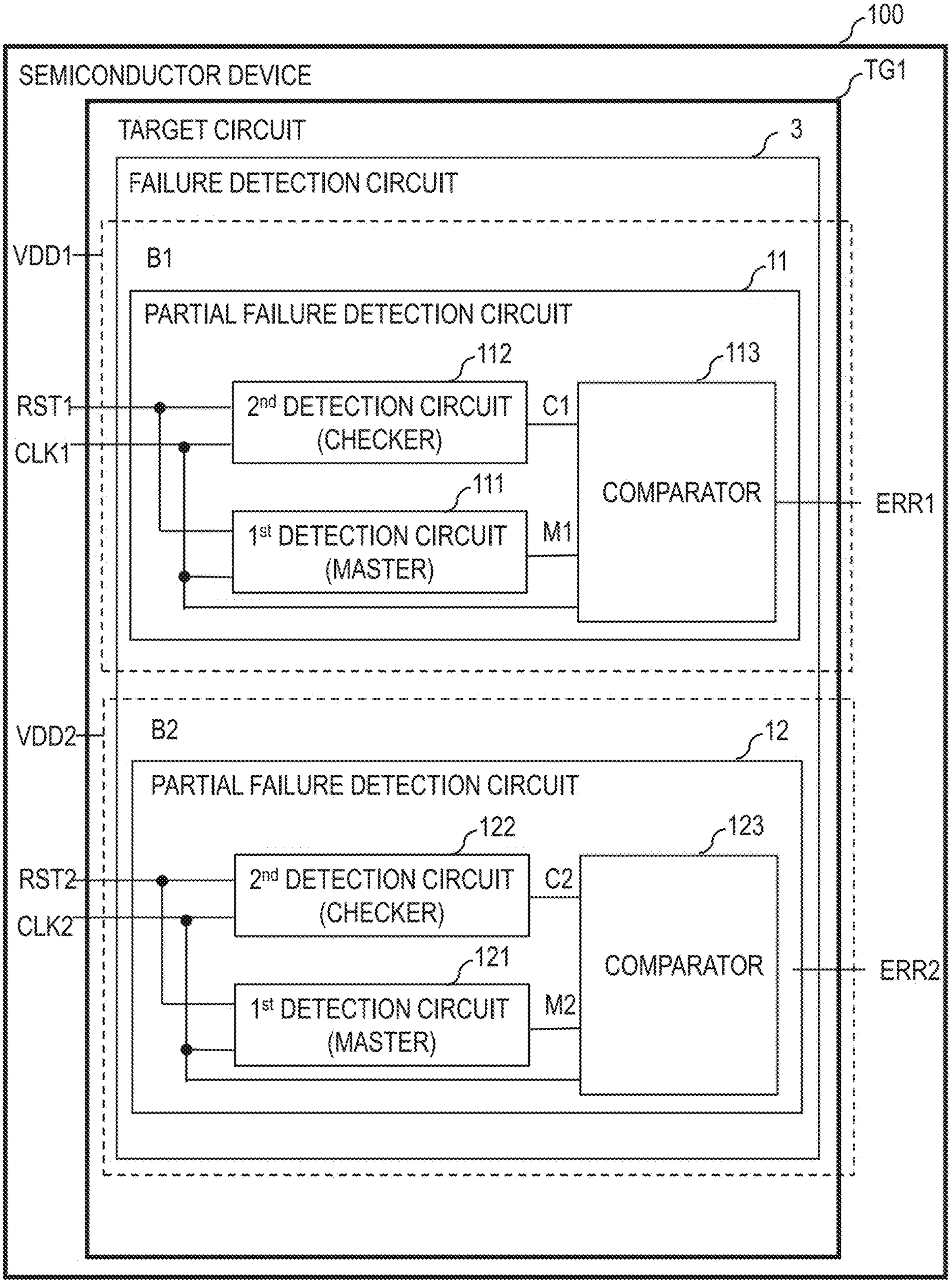
FIG. 9 is a block diagram showing a configuration example of a semiconductor device to which a failure detection circuit is applied according to the third embodiment.

FIG. 9 is a block diagram showing a configuration example of a semiconductor device 100. A failure detection circuit 3 according to the third embodiment is applied. The failure detection circuit 3 has the same circuit configuration as the failure detection circuit 2.

Here, in the failure detection circuit 3, the partial failure detection circuit 11 is disposed in the circuit area B1 driven by the power supply voltage VDD1, and the partial failure detection circuit 12 is disposed in the circuit area B2 driven by the power supply voltage VDD2. That is, the partial failure detection circuit 11 detects a failure of the circuit area B1 driven by the power supply voltage VDD1 of the target circuit TG1, and the partial failure detection circuit 12 detects a failure of the circuit area B2 driven by the power supply voltage VDD2 of the target circuit TG1.

Thus, the failure detecting circuit 3 according to this embodiment, it is possible to individually detect a failure of a plurality of circuit areas driven by differing power supply voltages of the target circuit TG1. This facilitates identification of the cause of the failure.

In this embodiment, the failure detection circuit 3 has been described as an example a case with two partial failure detection circuit 11, 12, but is not limited thereto. The failure detection circuit 3 may include three or more partial failure detection circuit disposed in three or more circuit areas driven by different power supply voltages.

Although the invention made by the inventor has been specifically described based on the embodiment, the present invention is not limited to the embodiment already described, and it is needless to say that various modifications can be made without departing from the gist thereof.

Furthermore, some or all of the processes of the failure detection circuit can be implemented by having CPU run a computer program.

The program described above includes a set of instructions (or software code) for causing the computer to perform one or more of the functions described in the embodiments when read into the computer. The program may be stored on a non-temporary computer-readable medium or on a tangible storage medium. By way of example and not limitation, computer-readable media or tangible storage media include: RAM (Random-Access Memory), ROM (Read-Only Memory, flash memory, SSD (Solid-State Drive) or other memory techniques, CD-ROM, DVD (Digital Versatile Disc), Blu-ray (registered trademark) disks or other optical disk storage, magnetic cassettes, magnetic tapes, magnetic disk storage or other magnetic storage devices. The program may be transmitted on a temporary computer-readable medium or communication medium. By way of example and not limitation, temporary computer readable media or communication media include electrically, optically, acoustically, or other forms of propagating signals.

What is claimed is:

1. A failure detection circuit provided in a target circuit having a first circuit area that operates in synchronization with a first clock signal, the failure detection circuit comprising:

a first detection circuit for outputting a first detection result obtained by transitioning a voltage level in synchronization with the first clock signal;

a second detection circuit for outputting a second detection result obtained by transitioning the voltage level in synchronization with the first clock signal; and a first comparison circuit for outputting a first comparison result by comparing the first detection result and the second detection result, wherein the first detection circuit outputs a third detection result obtained by transitioning a voltage level to the first detection result in synchronization with the first clock signal, wherein the second detection circuit outputs a fourth detection result obtained by transitioning the voltage level to the second detection result in synchronization with the first clock signal, and wherein the first comparison circuit compares the first detection result with the second detection result, further compares the third detection result with the fourth detection result, and outputs the first comparison result.

2. The failure detection circuit according to claim 1, wherein, when the first detection result and the second detection result match, the first comparison circuit outputs the first comparison result indicating that a failure has not occurred in the first circuit area, and wherein, when the first detection result and the second detection result do not match, the first comparison circuit outputs the first comparison result indicating that a failure has occurred in the first circuit area.

3. The failure detection circuit according to claim 1, wherein, when the first detection result and the second detection result match, and when the third detection result and the fourth detection result match, the first comparison circuit outputs a first comparison result indicating that a failure has not occurred in the first circuit area, when the first detection result and the second detection result do not match, or when the third detection result and the fourth detection result do not match, the first comparison circuit outputs a first comparison result indicating that a failure has occurred in the first circuit area.

4. The failure detection circuit according to claim 1, wherein the first detection circuit further comprises:

a first selector for selecting and outputting either a first initial value that is one of 0 and 1 or the first detection result based on a first reset signal;

a first flip-flop for capturing and outputting an output signal of the first selector in synchronization with the first clock signal; and a first inverter for inverting the output signal of the first flip-flop and outputting the first detection result, and wherein the second detection circuit further comprises:

a second selector for selecting and outputting by selecting either the first initial value or the first detection result based on the first reset signal;

a second flip-flop for capturing and outputting captures an output signal of the second selector in synchronization with the first clock signal; and a second inverter for inverting the output signal of the second flip-flop and outputting the second detection result.

5. The failure detection circuit according to claim 1, wherein the first detection circuit further comprises:

a first selector for selecting and outputting either a first initial value that is one of 0 and 1 or the first detection result based on a first reset signal;

a first flip-flop for capturing and outputting an output signal of the first selector in synchronization with the first clock signal; and a first inverter for inverting the output signal of the first flip-flop and outputting the first detection result, the second detection circuit further comprises:

a second selector for selecting and outputting by selecting either the first initial value or the first detection result based on the first reset signal;

a second flip-flop for capturing and outputting an output signal of the second selector in synchronization with the first clock signal; and a second inverter for inverting the output signal of the second flip-flop and outputting the second detection result, the first detection circuit further comprises:

a third selector for selecting and outputting either a second initial value that is other of 0 and 1 or the third detection result based on the first reset signal;

a third flip-flop for capturing and outputting an output signal of the third selector in synchronization with the first clock signal; and a third inverter for inverting the output signal of the third flip-flop and outputting the third detection result, and the second detection circuit further comprises:

a fourth selector for selecting and outputting by selecting either the second initial value or the fourth detection result based on the first reset signal;

a fourth flip-flop for capturing and outputting an output signal of the fourth selector in synchronization with the first clock signal; and a fourth inverter for inverting the output signal of the fourth flip-flop and outputting the second detection result.

6. The failure detection circuit according to claim 1, wherein the target circuit further includes a second circuit area which operates in synchronization with a second clock signal, and wherein the failure detection circuit further comprises:

a third detection circuit for outputting a third detection result of transitioning the voltage level in synchronization with the second clock signal;

a fourth detection circuit for outputting a fourth detection result obtained by transitioning the voltage level in synchronization with the second clock signal; and a second comparison circuit for outputting a second comparison result by comparing the third detection result and the fourth detection result.

7. The failure detection circuit according to claim 6, wherein, when the first detection result and the second detection result match, the first comparison circuit outputs a first comparison result indicating that a failure has not occurred in the first circuit area of the target circuit, wherein, when the first detection result and the second detection result do not match, the first comparison circuit outputs a first comparison result indicating that a failure has occurred in the first circuit area of the target circuit, wherein, when the third detection result and the fourth detection result match, the second comparison circuit outputs a second comparison result indicating that a failure has not occurred in the second circuit area of the target circuit, and wherein, when the third detection result and the fourth detection result do not match, the second comparison circuit outputs a second comparison result indicating that a failure has occurred in the second circuit area of the target circuit.

8. The failure detection circuit according to claim 6, wherein the first circuit area and the second circuit area are driven by different power supply voltages, wherein the first detection circuit, the second detection circuit, and the first comparison circuit are disposed in the first circuit area, wherein the third detection circuit, the fourth detection circuit, and the second comparison circuit are disposed in the second circuit area.

9. A semiconductor device comprises the failure detection circuit and the target circuit according to claim 1.

10. A failure detection method by a failure detection circuit provided in a target circuit having a first circuit area that operates in synchronization with a first clock signal, the failure detection method comprising:

outputting, by using a first detection circuit, a first detection result obtained by transitioning a voltage level in synchronization with the first clock signal, outputting, by using a second detection circuit, a second detection result obtained by transitioning the voltage level in synchronization with the first clock signal, outputting, by using a first comparison circuit, a first comparison result by comparing the first detection result and the second detection result, wherein the first detection circuit outputs a third detection result obtained by transitioning the voltage level to the first detection result in synchronization with the first clock signal, wherein the second detection circuit outputs a fourth detection result obtained by transitioning the voltage level to the second detection result in synchronization with the first clock signal, and wherein the first comparison circuit compares the first detection result with the second detection result, further compares the third detection result with the fourth detection result, and outputs the first comparison result.

* * * * *